(12) United States Patent
Kantipudi et al.

(10) Patent No.: US 8,621,303 B1
(45) Date of Patent: Dec. 31, 2013

(54) CLOCK CONTROL CIRCUITRY AND METHODS OF UTILIZING THE CLOCK CONTROL CIRCUITRY

(75) Inventors: Kalyana Ravindra Kantipudi, Sunnyvale, CA (US); Dhwani Shah, San Jose, CA (US); Jayabrata Ghosh Dastidar, Campbell, CA (US)

(73) Assignee: Altera Corporation, San Jose, CA (US)

( * ) Notice: Subject to any disclaimer, the term of this patent is extended or adjusted under 35 U.S.C. 154(b) by 59 days.

(21) Appl. No.: 13/354,706

(22) Filed: Jan. 20, 2012

Related U.S. Application Data

(60) Provisional application No. 61/580,627, filed on Dec. 27, 2011.

(51) Int. Cl.
*G01R 31/28* (2006.01)

(52) U.S. Cl.
USPC .......................................... 714/731; 714/726

(58) Field of Classification Search
USPC ......................................... 714/724, 731, 726
See application file for complete search history.

(56) References Cited

U.S. PATENT DOCUMENTS

| | | | |
|---|---|---|---|
| 6,529,033 B1* | 3/2003 | Park et al. | 326/16 |
| 7,346,822 B2* | 3/2008 | Warren et al. | 714/731 |
| 7,590,900 B2* | 9/2009 | Kim et al. | 714/724 |
| 7,640,461 B2* | 12/2009 | Nguyen et al. | 714/700 |
| 7,992,062 B2* | 8/2011 | Saint-Laurent et al. | 714/726 |
| 8,028,209 B2* | 9/2011 | Li et al. | 714/731 |
| 8,127,188 B2* | 2/2012 | Hasegawa | 714/731 |
| 8,412,994 B2* | 4/2013 | Devta-Prasanna | 714/731 |

* cited by examiner

*Primary Examiner* — James C Kerveros

(57) ABSTRACT

A design-for-test (DFT) circuitry is disclosed. The DFT circuitry includes a first multiplexer operable to transfer one of a clock signal or an inverted clock signal based on a clock polarity control signal. The DFT circuitry also includes a burst counter coupled to the first multiplexer. The burst counter is operable to output a signal at a first logic state for a predefined pulse count. The DFT circuitry also includes a second multiplexer that is operable to output one of the clock polarity control signal or the clock signal according to a signal output from the burst counter. The DFT circuitry may also include a third multiplexer that forwards control signals identifying the predefined pulse count to the burst counter from different sources such as an external pin, a programmable interconnect, and a memory element.

18 Claims, 10 Drawing Sheets

Generation of default clock '1' with two pulses

Generation of default clock '0' with three pulses

CLOCK CONTROL CIRCUITRY AND METHODS OF UTILIZING THE CLOCK CONTROL CIRCUITRY

This application claims the benefit of and claims priority to provisional patent application No. 61/580,627, filed Dec. 27, 2011, which is hereby incorporated by reference herein in its entirety.

BACKGROUND

Integrated circuits (IC) typically are made of a number of Intellectual Property (IP) blocks (e.g., reusable units of logic that may be used generically in numerous applications) blocks that perform various functions. The IP blocks collectively define the overall functionalities of the IC. IP blocks are tested using a plurality of testing methods. One of the testing methods includes marginal defect testing. Marginal defect testing involves checking for failures on the circuitry that arises from variations in the resistances, capacitances, and other properties. Existing circuits and techniques for marginal defect testing limit our ability to test efficiently and to test IP blocks with different clock polarities. For example, when testing an IC which includes logic circuit that can only be tested using at least three at-speed clock pulses and also having logic circuit that can be tested using only two at-speed clock pulses, existing circuits and techniques require the testing of the both logic circuits to be performed using three at-speed clock pulses, which is inefficient. "At-speed clock pulses" refer to clock pulses that are generated, and applied to circuitry utilizing the clock pulses, at approximately the same frequency (e.g., speed) as the circuitry is designed to operate at. While testing of some logic may be possible using clock pulses at lower than normal operating frequencies, such testing may not detect defects that only appear at normal operating frequencies.

It is within this context that the embodiments described herein arise.

SUMMARY

Embodiments described herein include clock control circuitry and methods of utilizing the clock control circuitry. It should be appreciated that the embodiments can be implemented in numerous ways, such as a process, an apparatus, a system, a device, or a method. Several embodiments are described below.

In one embodiment, design-for-test (DFT) circuitry is disclosed. The DFT circuitry includes a first multiplexer operable to transfer one of a clock signal or an inverted clock signal based on a clock polarity control signal. The DFT circuitry also includes a burst counter coupled to the first multiplexer. The burst counter is operable to output a signal at a first logic state for a predefined pulse count. The DFT circuitry also includes a second multiplexer that is operable to output one of the clock polarity control signal or the clock signal according to a signal output from the burst counter.

In an alternative embodiment, a method to test an integrated circuit (IC) is disclosed. The method includes receiving a clock signal and a clock control polarity signal. The method further includes transferring the clock signal to a burst counter. The method also includes inserting information on a predefined count period into the burst counter. The method further includes outputting a first signal from the burst counter for the predefined count period. Additionally, the method includes outputting a second signal from the burst counter after the predefined count period. Finally, the method includes sending the clock signal to the integrated circuit for the predefined count period in response to the first signal and sending a static signal to the integrated circuit after the predefined count period in response to the second signal.

Further features of the invention, its nature and various advantages will be more apparent from the accompanying drawings and the following detailed description of the preferred embodiments.

DETAILED DESCRIPTION

The following embodiments describe clock control circuitry and methods of utilizing the clock control circuitry. It will be obvious, however, to one skilled in the art, that the present embodiment may be practiced without some or all of these specific details. In other instances, well-known operations have not been described in detail in order not to unnecessarily obscure the present embodiment.

In one embodiment, design-for-test (DFT) circuitry that generates a default one clock and a default zero clock based on a clock polarity control signal is described. The phrase "default one clock" may be used herein to refer to clock signals for circuitry that is designed to receive a static logic one signal as a clock signal when the circuitry is idle and that is designed to perform logic operations each time the clock signal for the circuitry includes a logic zero signal pulse. Conversely, the phrase "default zero clock" may be used herein to refer to clock signals for circuitry that is designed to receive a static logic zero signal as a clock signal when the circuitry is idle and that is designed to perform logic operations each time the clock signal for the circuitry includes a logic one signal pulse. The DFT circuitry may also generate substantially high speed clock pulses as part of the default one clock or default zero clock, if desired. The DFT circuitry enables IP block testing independent of its clock polarity requirements. The DFT circuitry also enables testing of IP blocks having a variety of sequential traversing logic depths (e.g., IP blocks that require different minimum numbers of clock pulses for testing). The DFT circuitry provides significantly higher margin defects coverage without increasing the test time.

Figure 1:
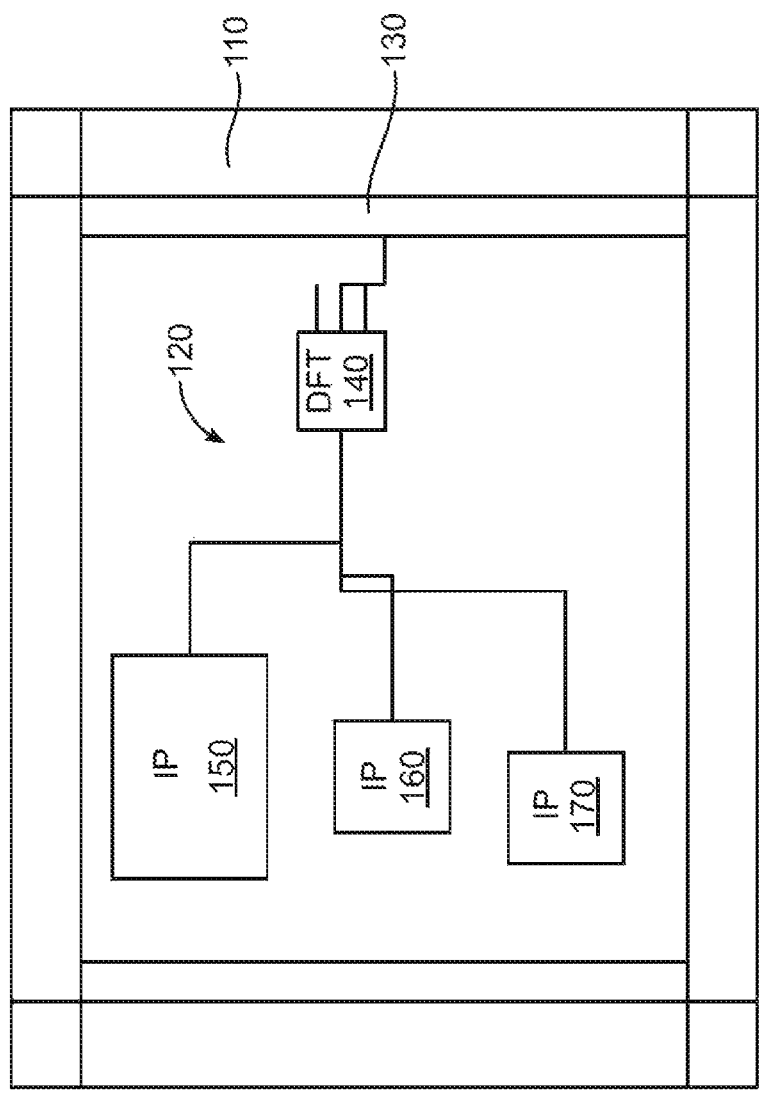
FIG. 1, meant to be illustrative and not limiting, illustrates an Integrated Circuit (IC) with clock controllable Design-For-Test (DFT) circuitry in accordance with an embodiment of the present invention.

FIG. 1, meant to be illustrative and not limiting, illustrates an Integrated Circuit (IC) with clock controllable Design-For-Test (DFT) circuitry in accordance with one embodiment. IC 100 includes Input Outputs (IOs) 110, core logic 120 and Phase Locked Loops (PLLs) 130. The functions of IC 100 include electrical functions, e.g., storing data, executing instructions, etc. In one embodiment, IC 100 can be a Programmable Logic Device (PLD), an Application Specific Integrated Circuit (ASIC) or an Application Specific Standard Product (ASSP). In another embodiment, IC 100 is a system on a chip (SoC) device.

IO 110 receives/transmits electrical signals in/out from IC 100. The electrical signals can be substantially high speed electrical signal, e.g., signals with a frequency greater than 1 GHz. The functions of IO 110 include providing a communication interface to external devices. In one embodiment, IO 110 is located at the periphery of IC 100. In another embodiment, IO 110 is located on the inner portion of IC 100.

PLLs 130 may generate a clock signal based on a clock signal input into IC 100. PLLs 130 may synchronize one or more internal clock signals with one or more external clock signals (e.g., to facilitate communication between IC 100 and external circuits). It is appreciated that each PLL 130 may be considered a clock source within IC 100. In one embodiment, PLL circuitry 130 is located on the left and right periphery of IC 100. The clock signals generated by PLL 130 may also be supplied to DFT 140.

Core logic 120 performs core functions that may define IC 100. In one embodiment, core logic 120 performs electrical functions on input data signals. Core logic 120 may include a plurality of programmable logic elements (LEs) in one embodiment. Core logic 120 may also includes a plurality of interconnection means that enable communication between circuit components within IC 100. Data signals can be received by core logic 120 through IO 110 or transmitted out of core logic 120 via IO 110.

Core logic 120 includes DFT circuitry 140 and Intellectual Property (IP) blocks 150, 160 and 170, as illustrative examples. IP blocks 150, 160 and 170 may be proprietary circuitry blocks performing an electrical function. In one embodiment, IP blocks 150, 160 and 170 are logic array blocks (LABs), digital signal processing (DSP) blocks, processor blocks, memory control blocks, etc. IP blocks 150, 160 and 170, together with other IP blocks (not shown), collectively perform the core functions of IC 100. In another embodiment, a collection of different circuitry, e.g., the logic array blocks, the DSP blocks, etc., may form one or more of IP blocks 150, 160 or 170.

In one embodiment, IP blocks 150, 160 and 170 are soft IP block implemented by way of programming (e.g., the logic of the IP blocks may be programmable). In another embodiment, IP blocks 150, 160 and 170 are hard IP blocks implementing circuitry with a specific functionality (e.g., the logic of the IP blocks may be hardwired during manufacturing). The soft IP blocks are available on PLDs through programming the programmable logic elements and interconnections. In one embodiment, the soft IP blocks are programmed through an Electronic Design Automation (EDA) tool, such as Altera's Quartus II.

IP blocks 150, 160 and 170 may vary in terms of sequential data traversing depth. This variation means that a different number of clock pulses for allowing data signals to propagate through (e.g., from an input of an IP block to an output, such as a scannable output, of that IP block) may be required. Examples of IP blocks 150, 160 and 170 that may require different clock signals include interconnect circuitry, partially scannable circuitry and memory interfacing circuitry. In one embodiment, IP block 150 requires three clock pulses, whereas IP blocks 160 and 170 each require two clock pulses. It is appreciated that the movement of the data within each IP block can be performed at the rising edge of a clock pulse (or at the falling edge of a clock pulse).

It is appreciated that each IP block 150, 160 or 170 may include plurality of interconnections and gates. Marginal defect testing may be performed to verify each of the interconnections and gates. The marginal defect testing identifies flipping interconnection errors (flipping interconnection errors may be interconnections that fail at one instance and pass at another instance). The marginal defect testing includes transferring test data into IP blocks 150, 160 or 170, subjecting the test data to the logical processes of the IP blocks 150, 160 or 170, and reading the data out from the IP blocks. It is appreciated that each IP block 150, 160 or 170 may require different default clock polarity signals for operation and testing. A clock having a default zero polarity may be formed from logic one positive pulses that rise above a default logic zero ground baseline. A clock having a default one polarity may be formed from logic zero ground pulses that fall below a default logic one baseline. Examples of IP block 150, 160 or 170 that require different default clock polarity signal are LABs, DSP blocks, third party protocols, etc. The marginal defect testing may only be performed satisfactorily if the appropriate default clock signal is provided to the IP block.

In one embodiment, DFT circuitry 140 is a default clock generator circuitry. DFT circuitry 140 generates a default one clock or a default zero clock depending on an applied clock polarity control signal. In one embodiment, DFT circuitry 140 generates a default one clock signal when the clock polarity control signal is one and generates a default zero clock signal when the clock polarity control signal is zero. It is appreciated that the clock polarity control signal may be a user defined signal and can be selected to be one or zero depending on which particular IP block is being tested at that time.

DFT circuitry 140 receives clocks from a plurality of clock sources, e.g., a clock signal from PLLs 130, external circuits, etc. In one embodiment, DFT circuitry 140 generates default one or zero clock signals utilizing the received clock signal. The default one or zero clock signal is supplied to each of the appropriate IP blocks 150, 160 and 170. Each of IP blocks 150, 160 and 170 may be capable of controlling whether to receive the default one or zero clock signal by a controlling input, e.g., scan enable signal. In another embodiment, DFT circuitry 140 generates a default one or zero clock signal with pulses.

DFT circuitry 140 is located within core logic 120. In one embodiment, DFT circuitry 140 is intermediate between a clock source and the IP blocks that require the default clocks. In another embodiment, DFT circuitry 140 is a part of the global clock network that supplies clock signals to various circuits of IC 100.

Figure 2:
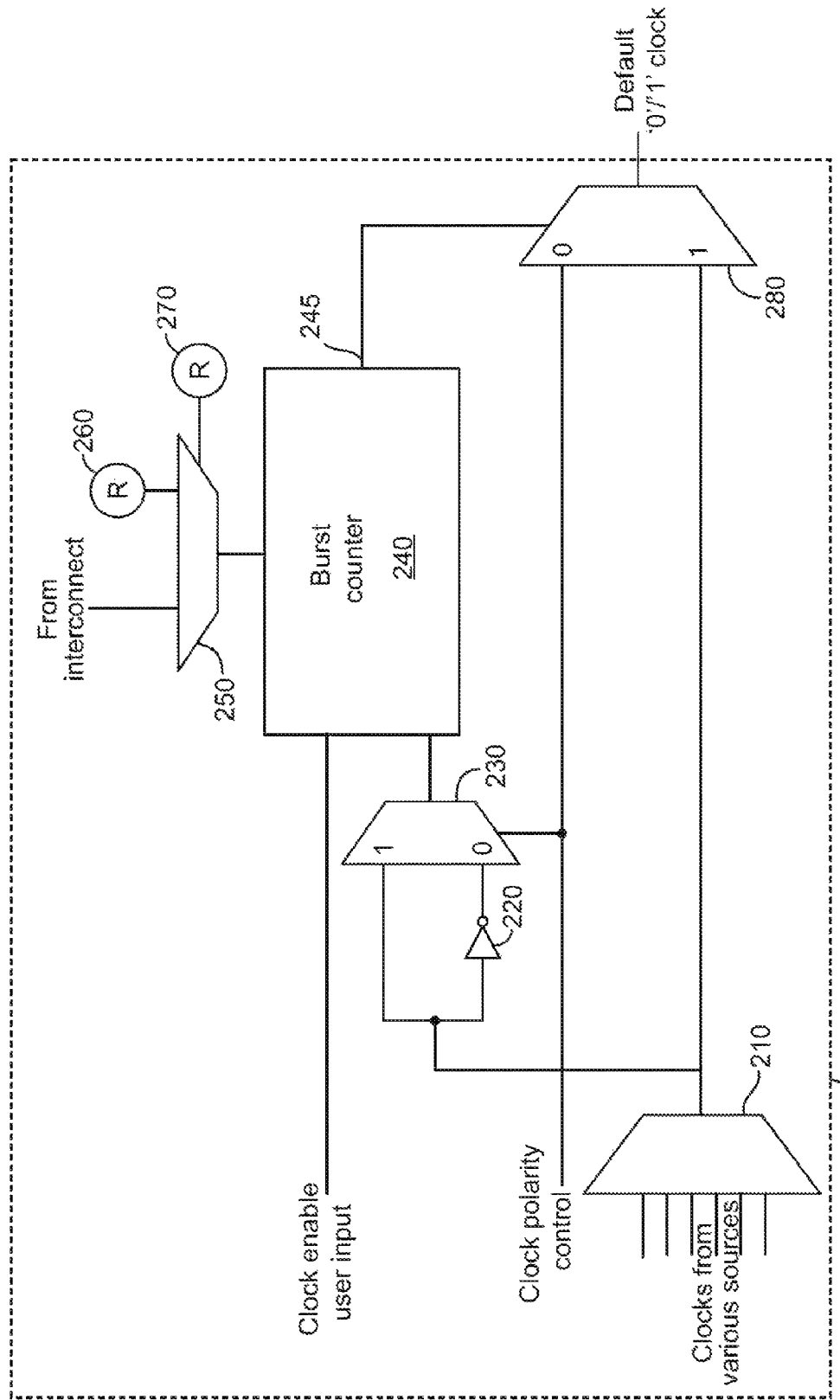
FIG. 2, meant to be illustrative and not limiting, illustrates a detailed implementation of clock controllable DFT circuitry in accordance with an embodiment of the present invention.

FIG. 2, meant to be illustrative and not limiting, is an implementation of clock controllable Design-For-Test (DFT) circuitry in accordance with one embodiment. DFT circuitry 140 is one form of implementation as illustrated in FIG. 1. DFT circuitry 140 may include multiplexer 210, 230, 250 and 280, NOT gate 220 (e.g., inverter 220) and burst counter 240. DFT circuitry 140 may receive a clock control polarity signal, a clock enable user input signal, a burst counter signal (e.g., a signal representing the number of clock pulses that are to be generated), and a plurality of clock signals from various clock sources. The burst counter signal may be received from two different sources, e.g., interconnects and memory elements. It is appreciated that each of multiplexers 210, 230, 250 and 280 functions as a gateway for selecting an applied signal to propagate through that multiplexer.

Multiplexer 210 may receive a plurality of clock signals from various clock sources. In one embodiment, one of the clocks is received from PLL circuitry such as PLL 130 of FIG. 1. Multiplexer 210 selects one of the clock signals to be transferred through subsequent stages of DFT 140. Multiplexer 210 is coupled to multiplexers 230 and 280. The selected clock signal is transferred from multiplexer 210 to multiplexers 230 and 280. It is appreciated that the selection of clock signals may be performed by the user via external means, e.g., through registers or one or more IO pins, or by signals generated from internal circuits. In one embodiment, each of the clock signals may vary with time as illustrated by the clock signal timing diagrams in FIGS. 4A-4D.

Multiplexer 230 has two inputs and a control signal. Both inputs may be based on the output of multiplexer 210. Multiplexer 230 may receive the selected clock signal output from multiplexer 210 and an inverted version of that selected clock signal at respective input terminals. The inversion of the selected clock signal may be performed by inverter 220. Inverter 220 is intermediate to the output terminal of multiplexer 210 and an input terminal of multiplexer 230. In one embodiment, the inverted clock signal varies with time as illustrated by the inverted clock signal timing diagram in FIGS. 4A-4D.

In one embodiment, multiplexer 230 may receive the selected clock signal at terminal one and the inverted clock signal at terminal zero. Multiplexer 230 also receives the clock polarity control signal. The clock polarity control signal with a logic one is illustrated by the clock polarity control signal timing diagrams in FIG. 4A and FIG. 4C. The clock polarity control signal with logic zero is illustrated by the clock polarity control signal timing diagram in FIG. 4B and FIG. 4D. The selected clock signal may be transmitted through multiplexer 230 when the clock polarity control signal is one. The inverted clock signal may be transmitted through the multiplexer 230 when the clock polarity control signal is zero. The output terminal of multiplexer 230 is coupled to burst counter 240. Hence, the output from multiplexer 230 is transmitted to burst counter 240 for further processing.

Multiplexer 230 may serve to convert clock signals output from multiplexer 210 into a default one clock format, regardless of whether the clock signals output from multiplexer 210 are in a default one or a default zero clock format. If desired, multiplexer 230 may be configured to convert clock signals output from multiplexer 210 into a default zero clock format. With arrangements of this type, the complexity of burst counter 240 may be reduced, as burst counter 240 only needs to be capable of handling one type of clock format (e.g., either default one or default zero clocks).

Optional multiplexer 250 receives two inputs and a control signal. Multiplexer 250 transmits burst count information signals to burst counter 240. The burst count information signals may represent the number of clock pulses that are to be applied to a particular IP block or group of IP Blocks during a particular testing operation. In one embodiment, the burst count information signals may be retrieved from interconnections coupled to an IO pin. In another embodiment, the burst count information signals may be retrieved from memory elements/registers such as memory elements 260. The memory elements/registers may form part of core block 120 of FIG. 1. It is appreciated that the memory elements/registers can be a part of Configuration Random Access Memory (CRAM) in a PLD. The control signal may also be transmitted from another memory element/register such as memory elements 270. It is appreciated that the memory elements/registers can be programmable through EDA software.

Burst counter 240 receives the output signal of multiplexer 230 (e.g., the selected clock signal or an inverted version of the selected clock signal, depending on the logic level of the clock polarity control signal), the clock enable user input signal and the output signal of multiplexer 250 (e.g., information on the number of clock pulses in a desired burst of clock pulses). In one embodiment, burst counter 240 may be enabled when the clock enable user input signal transitions from logic zero to one. On the other hand, burst counter 240 may be disabled when the clock enable user input signal is at a logic zero level. Burst counter 240 transmits an output from its output terminal 245. Burst counter 240 transmit output signals having a logic value of one at the transition of zero to one of the clock signal input into burst counter 240 through multiplexer 230. In one embodiment, burst counter 240 transmits signals having a logic value of one for a specified number of pulses after the user enable input signal transits from logic zero to one. The output of burst counter 240 is illustrated by the burst counter output signal timing diagrams in FIGS. 4A, 4B, 4C, and 4D.

In one embodiment, burst counter 240 transmits an output that has a logic state that is static for a predetermined period. The period is subject to the burst information that is programmed into burst counter 240 (e.g., via internal interconnectors or memory elements 260). FIG. 4C illustrates the output when the burst count information is two (e.g., when burst counter 240 is configured to count two clock cycles before directing multiplexer 280 to output the static clock polarity control signal). Burst counter 240 may be steady at the logic state of one for two clock cycles (from T3 to T7). In one embodiment, the logic state that is static is the logic state one, which is the default clock state (e.g., the initial logic state that is between T1 and T2) of the selected clock signal entering burst counter 240. At the completion of the two clock cycles (e.g., on or immediately after T7), the burst counter output may go low, such that the default clock output mirrors the static clock polarity control signal. It is appreciated that in practicality there could be minor delays between each respective signal if compared to signal timing diagrams illustrated in FIGS. 4A-4D. The delays are not shown within FIGS. 4A-4D in order not to obscure the present invention.

Multiplexer 280 receives two input signals, i.e. the clock polarity signal and the selected clock signal. Multiplexer 280 also receives a control signal, i.e. the burst counter output. A signal propagates through multiplexer 280 from terminal zero when the control signal is of logic value zero. Multiplexer 280 enables propagation of the signal from terminal one, i.e. the selected clock signal, when the control signal is a logic one. The clock control polarity control signal is transferred when the control signal is logic value zero and the selected clock signal is transferred when the control signal is logic value one. In one embodiment, the clock control polarity signal is applied to terminal zero of multiplexer 280 and the selected clock signal is applied to terminal one of multiplexer 280. If desired, the clock control polarity signal may be applied to terminal one of multiplexer 280 and the selected clock signal may be applied to terminal zero of multiplexer 280.

Figure 4A:
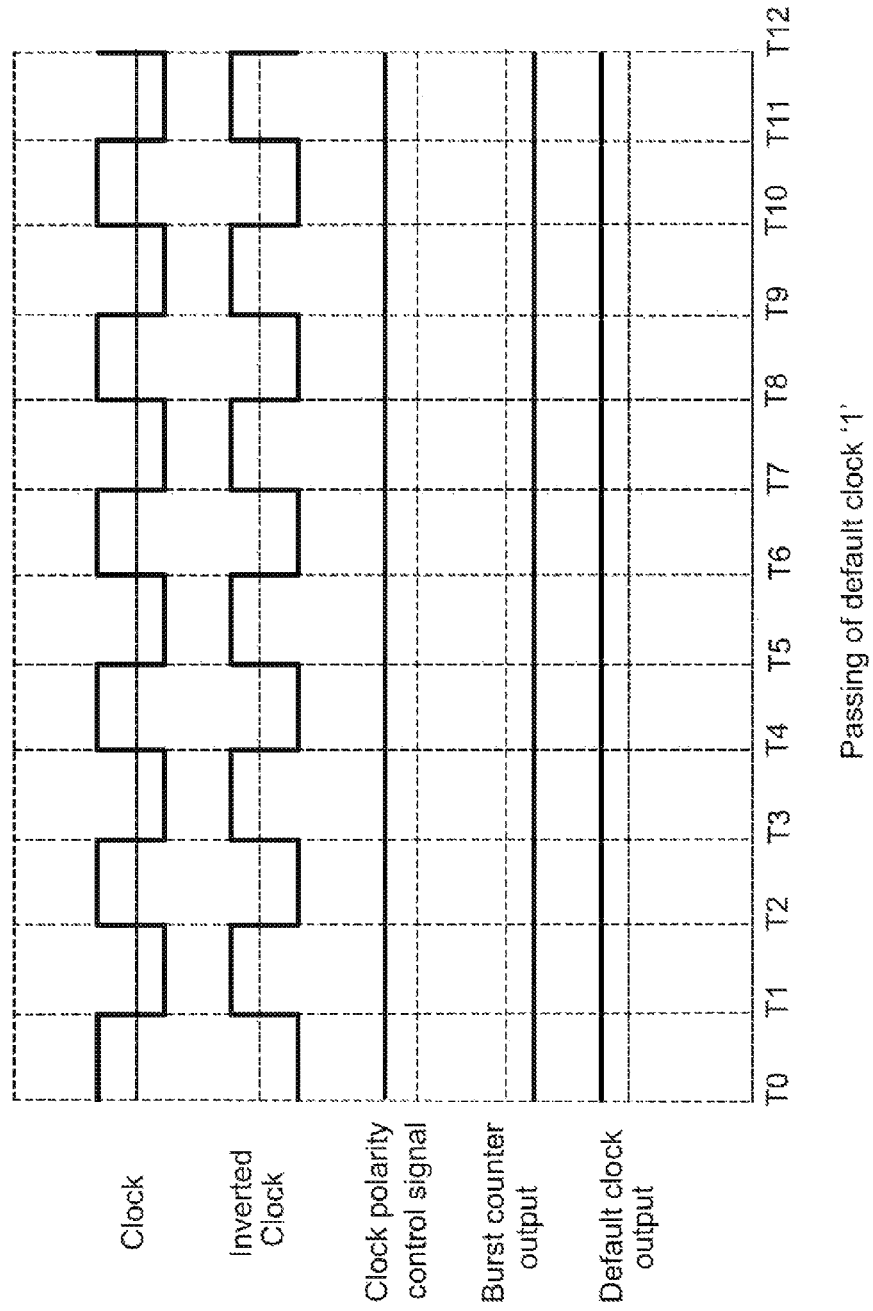
FIGS. 4A-4D, meant to be illustrative and not limiting, illustrate respective timing charts showing a default one clock, a default zero clock, a default one clock having two pulses, and a default zero clock having three pulses in accordance with an embodiment of the present invention.
Figure 4B:
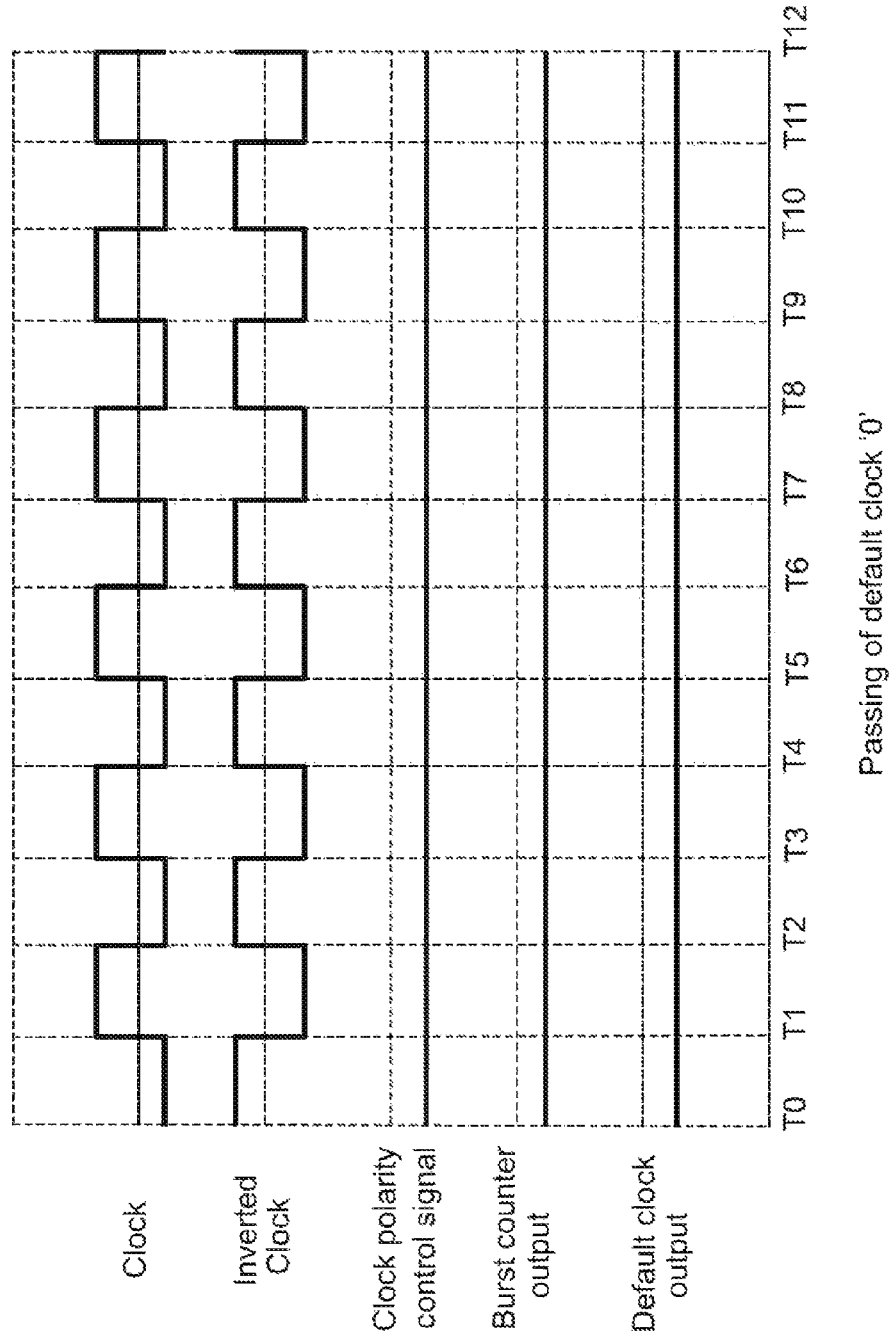
Figure 4C:
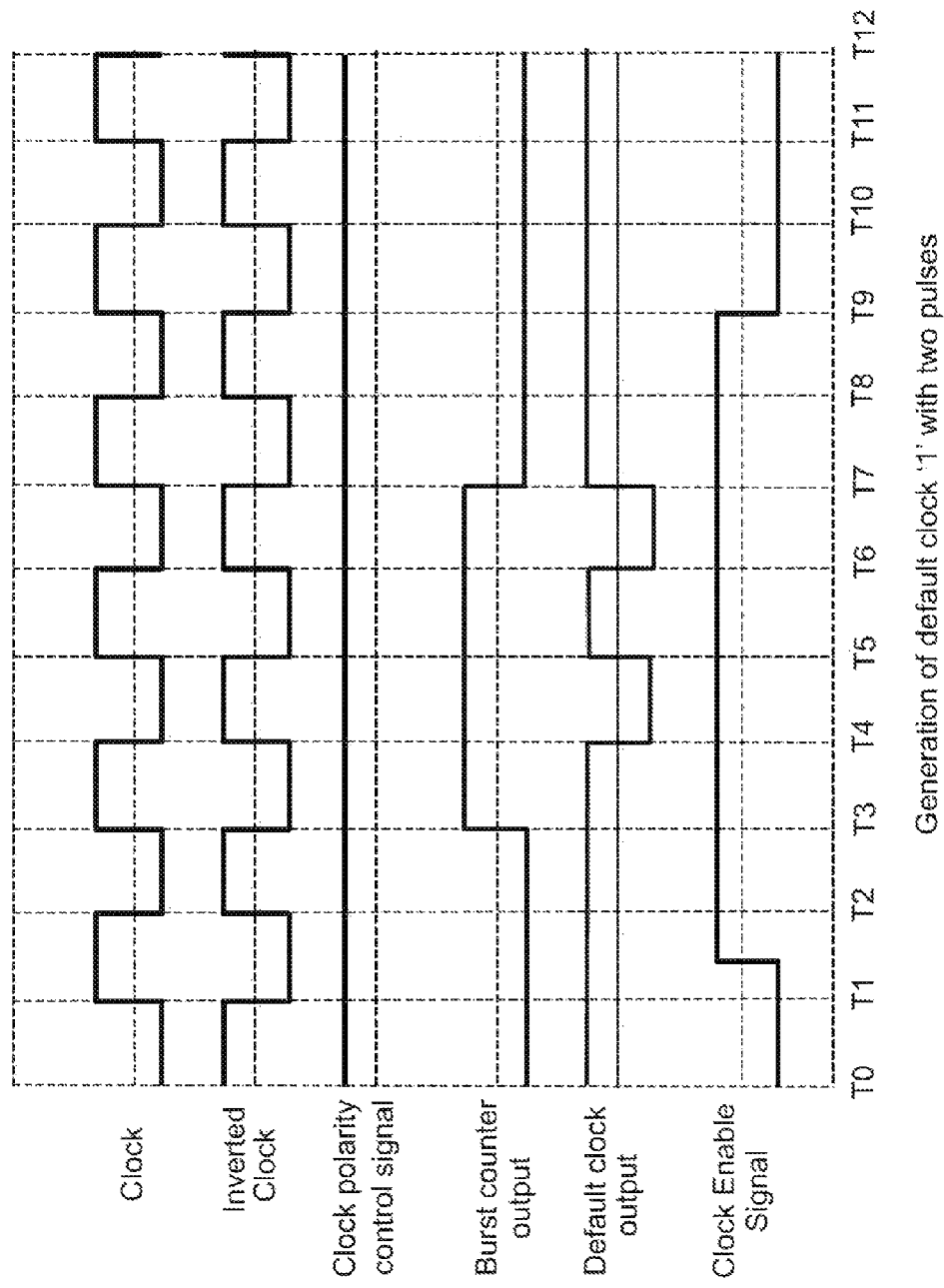

The value of the control signal controlling multiplexer 280 may vary over the time, as illustrated by the burst counter output signal timing diagrams in FIGS. 4A-4D. In FIG. 4A and FIG. 4B, the burst counter output signal is at static value of logic zero from period of T0-T12. However, in FIG. 4C and FIG. 4D, the burst counter output signal is at logic one for a period (T3-T7 in FIG. 4C and T3-T9 in FIG. 4D) and then changes to static value of logic zero for any remaining period (T0-T13 and T7-T12 in FIG. 4C and T0-T3 and T9-T12 in FIG. 4D).

Figure 4D:
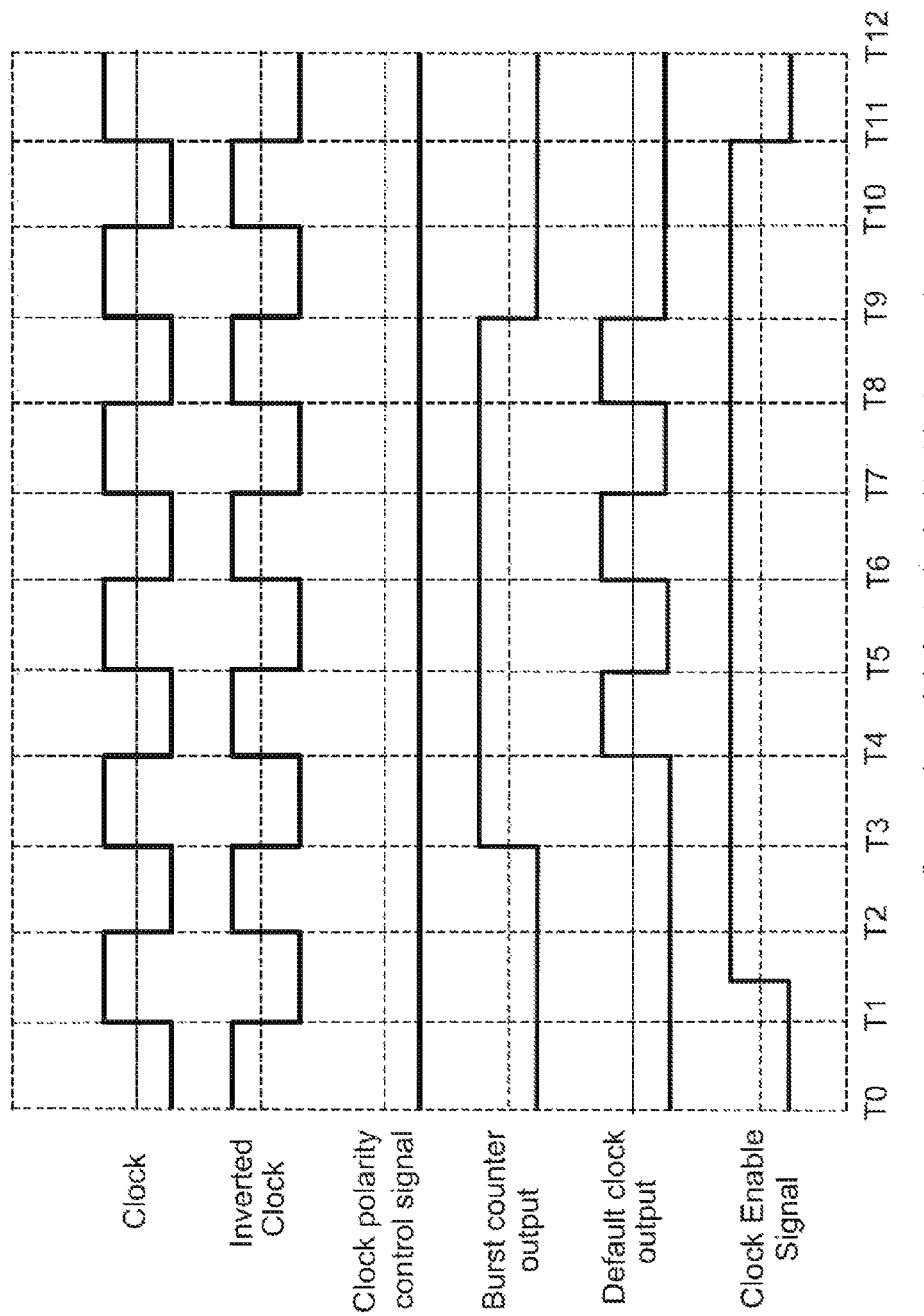

Therefore, in FIG. 4A, the output of multiplexer 280 is the clock control polarity signal having a logic one. In FIG. 4B, the output of multiplexer 280 is the clock control polarity signal having a logic zero. However, when the burst counter output signal is at logic one, the selected clock signal is transmitted through multiplexer 280. In FIG. 4C and FIG. 4D, the selected clock signal is transmitted through multiplexer 280 from T3-T7 and T3-T9, respectively. Subsequently, the clock control polarity signal is transmitted through multiplexer 280. The clock polarity control signal is transmitted through multiplexer 280 from T0-T3 and T7-T12 for FIG. 4C and T0-T3 and T9-T12 for FIG. 4D, respectively.

Figure 3:
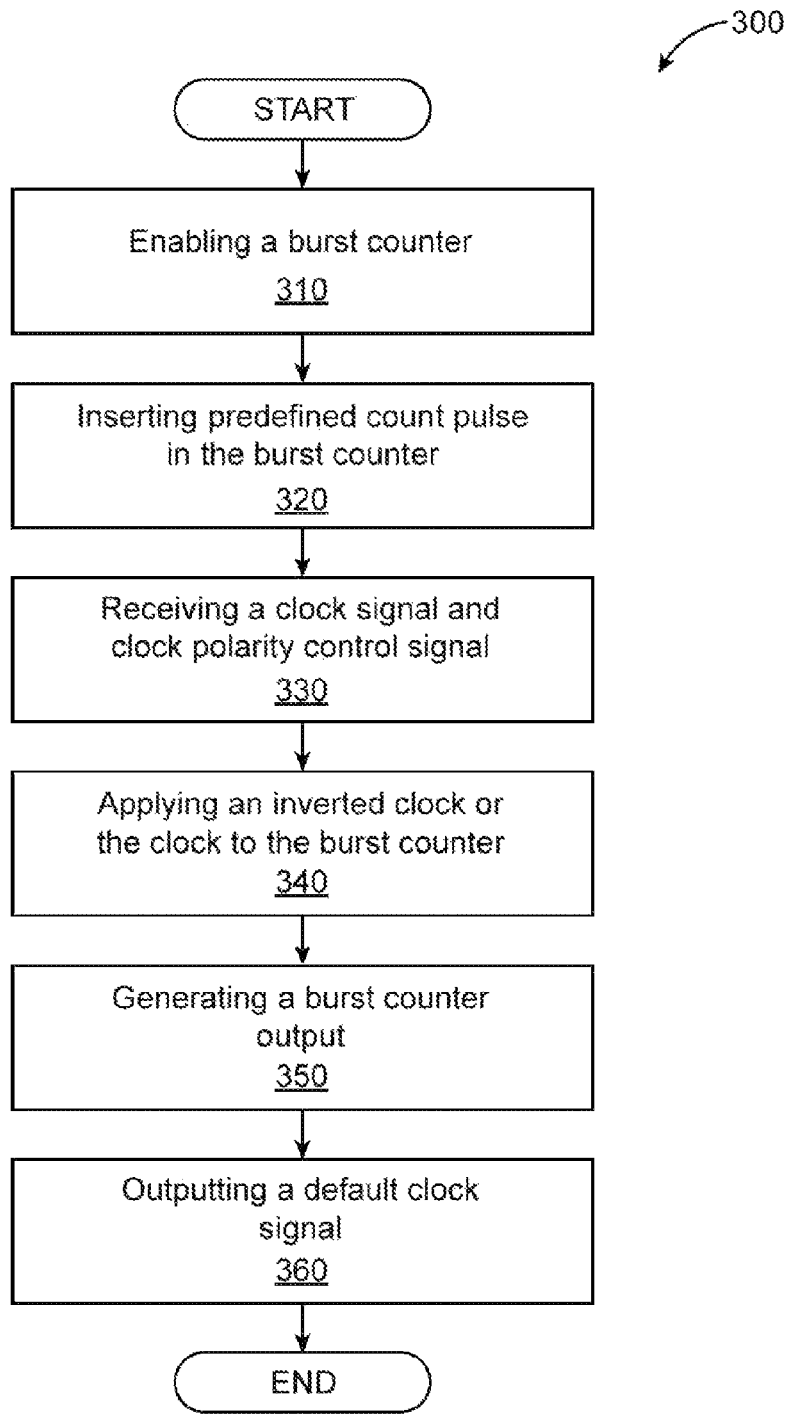
FIG. 3, meant to be illustrative and not limiting, shows illustrative steps involved in a method of utilizing DFT circuitry such as the DFT circuitry of FIG. 2 in accordance with an embodiment of the present invention.

FIG. 3, meant to be illustrative and not limiting, shows illustrative steps involved in a method to operate design-for-test (DFT) circuitry in accordance with one embodiment. The method 300 includes enabling a burst counter as in operation 310. The burst counter may be substantially similar to burst counter 140 in FIG. 2. In one embodiment, the burst counter is controlled through a clock enable user input signal. The burst counter is in active mode when the clock enable user input signal transitions from zero to one. The burst counter remains in active mode for a predefined pulse count. The burst counter is in a disabled mode at remaining periods.

A predefined pulse count is inserted in the burst counter as in operation 320. The predefined pulse count can be of value of zero to 'N', where N is 1, 2, 3, and so on.

The predefined pulse count information is utilized to generate the number of pulses within the default clock generated by the DFT. The predefined pulse count can be transmitted from a multiplexer, e.g. multiplexer 250 in FIG. 2. It is appreciated that the predefined pulse count may be received from interconnects coupled to 10 pins, configurable memory elements, or registers within the IC.

The DFT circuitry receives a clock signal and a clock polarity control signal as in operation 330. The received clock signal is selected from a plurality of clock signals. In one embodiment, the selection is performed using a multiplexer, e.g. multiplexer 210 in FIG. 2. The clock signal or inverted clock signal is applied to the burst counter as in operation 340. The clock signal can be inverted through an inverter, e.g. inverter 220 in FIG. 2. Multiplexer 230 of FIG. 2 can be used to select a clock signal to be transmitted into the burst counter. The selection is based on the clock polarity control signal.

A burst counter output is generated as in operation 350. In one embodiment, the burst counter output has static value of logic zero, as illustrated in FIGS. 4A and 4B. The burst counter output has logic value of zero when the predefined count pulse is zero or the burst counter is disabled (by supplying a logic zero for clock enable user input).

In another embodiment, the burst counter output is at logic value of one for a predetermined period and changes to logic value of zero for subsequent period, as illustrated in FIG. 4C and FIG. 4D. The burst counter output has logic value of one for a period that is determined by the pulse count. In one embodiment, burst counter 240 may output a logic one value for the pulse count period (e.g., two, three, or another number of clock cycles). The clock enable signal may signal the start of a burst of clock cycles. The pulse count period is two clock pulses in FIG. 4C and three clock pulses in FIG. 4D.

Figure 5A:
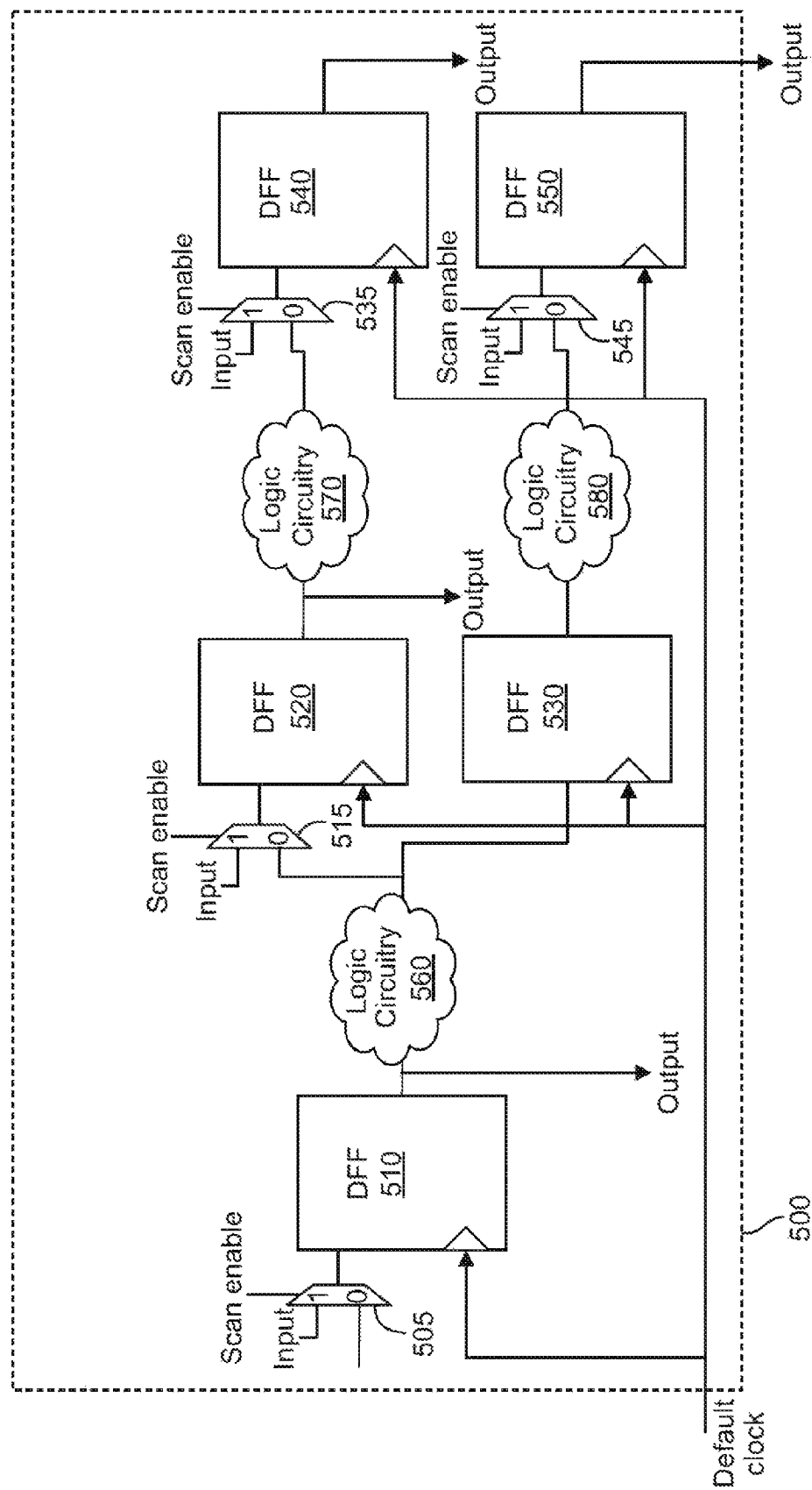
FIG. 5A, meant to be illustrative and not limiting, illustrates an IC that is being tested in accordance with an embodiment of the present invention.

FIG. 5A, meant to be illustrative and not limiting, illustrates an Intellectual Property (IP) block that is being tested in accordance with one embodiment. The IP block 500 can be any of IP blocks 150, 160 or 170 of FIG. 1. In one embodiment, the IP block 500 is a partially scannable scan chain block, which is a scan chain whereby a few of registers are only scannable via another register. The IP block 500 includes logic circuitry 560, 570 and 580. The IP block 500 also includes digital flip-flops (DFFs) 510, 520, 530, 540 and 550 and multiplexers 505, 515, 535 and 545. The signals coupled to DFFs 510, 520, 530, 540 and 550 and the signals coupled to multiplexers 505, 515, 535 and 545 are not described in further details in order not to obscure the present invention.

Figure 5B:
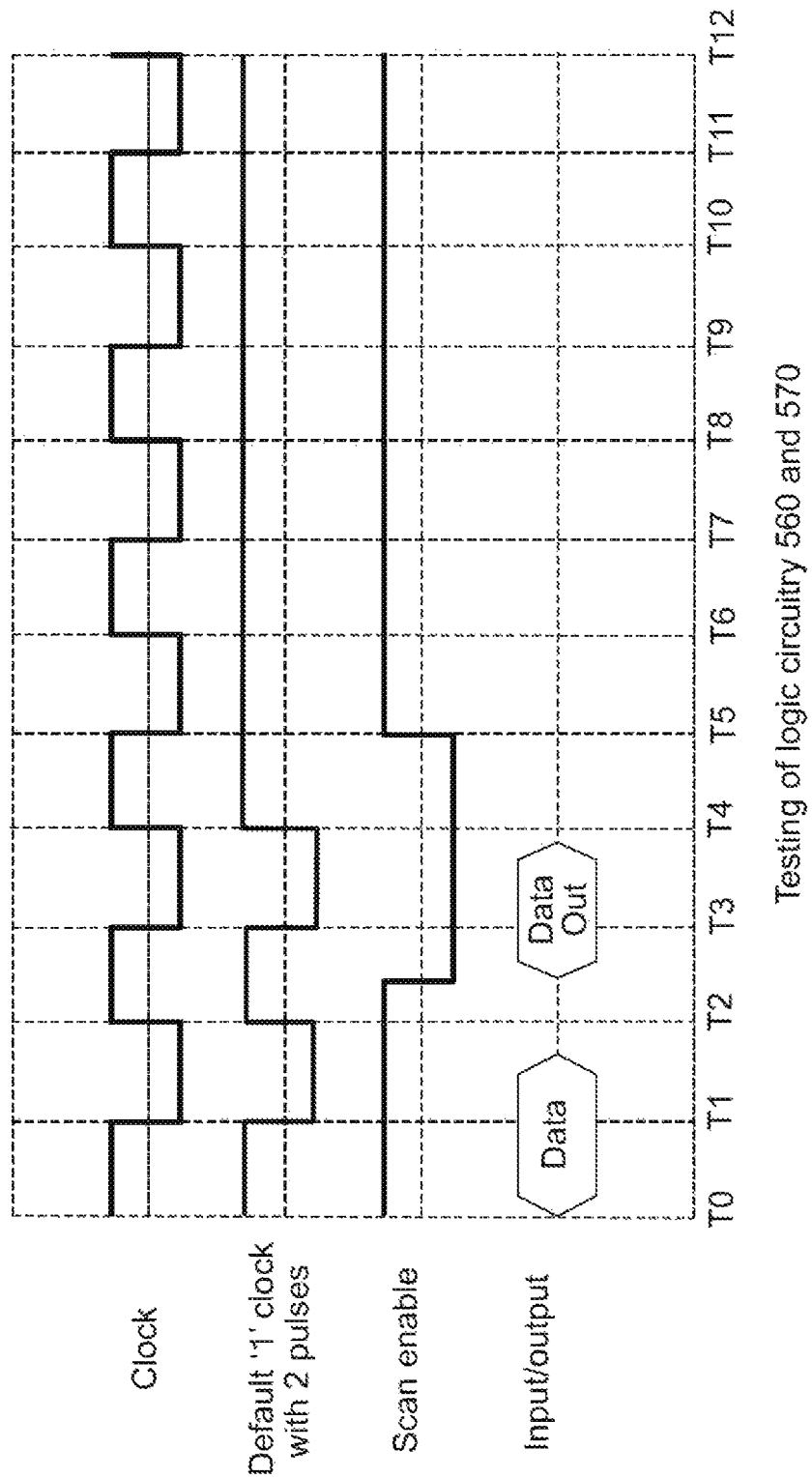
FIG. 5B-5C, meant to be illustrative and not limiting, illustrate timing charts for testing the respective IP blocks of the IC that is being tested in FIG. 5A in accordance with an embodiment of the present invention.

Logic circuitry 560 can be tested through inserting Input Output (IO) signals, scan enable signals, default clock signals and clock signal as illustrated in FIG. 5B. A test data signal to test logic circuitry 560 is received at the input terminal of multiplexer 505. The test data is illustrated by the "data" on the IO signal timing diagram in FIG. 5B. The "data" is available from the period T0. The scan enable signal is of logic state one from the period T0 until a period somewhere between T2 and T3, and within that period the "data" is transferred through the multiplexer 505 and into DFF 510. The "data" is loaded into DFF 510 at the first rising edge of the default one clock signal, which is at time T2. The loaded data propagates through logic circuitry 560 and logic circuitry 560 generates a testing result illustrated as "data out" in FIG. 5B. The scan enable signal has a logic state of zero from the period between T2 and T3 until T5, which enables the "data out" to propagate through multiplexer 515 and into DFF 520. On the next rising edge of the default one clock, the "data out" is loaded into DFF 520 and is ready to be transferred out from the output terminal via DFF 520.

Figure 5C:
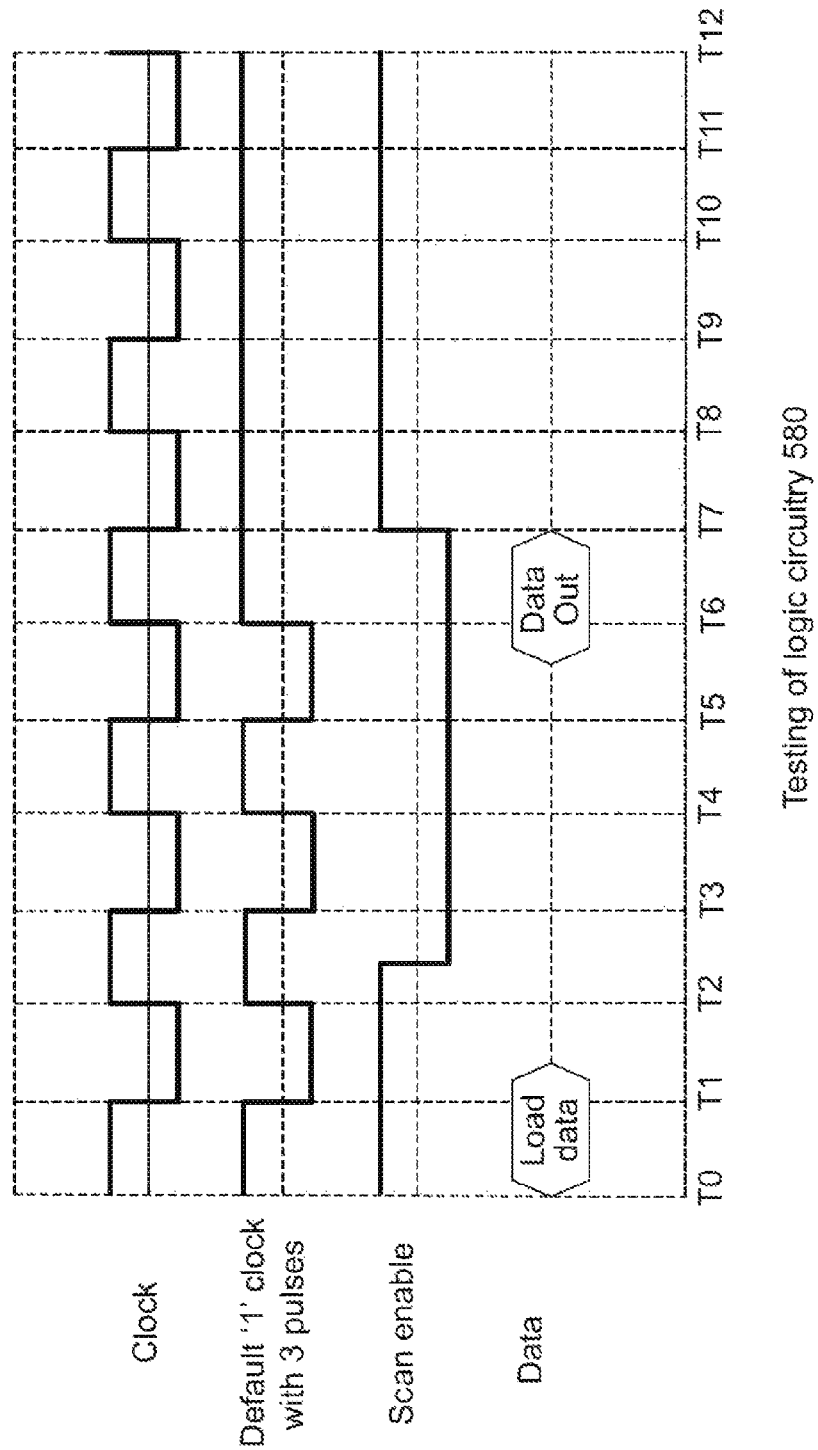

Logic circuitry 580 can be tested through inserting Input Output (IO) signals, scan enable signals, default clock signals and clock signals as illustrated in FIG. 5C. Test data to test logic circuitry 580 is provided at the input terminal of multiplexer 505. The test data is illustrated by the "load data" on the IO signal timing diagram. The "load data" is available from the period T0. The scan enable signal has logic state of one from the period of T0 until somewhere between T2 and T3, and within that period, the "load data" is transferred through multiplexer 505 and into DFF 510. The "load data" is loaded into logic circuitry 560 on a first rising edge of the default one clock signal, at time T2, and is received by the input terminal of DFF 530. On the second rising edge of default clock one signal, the "load data" is transferred through DFF 530 and is loaded into (e.g., applied onto) logic circuitry 580. Logic circuitry 580 generates a testing result identified by "data out." The scan enable signal has its logic state of zero from the period between T2 and T3 until T7, which enables "data out" to propagate through multiplexer 545 and into DFF 550. On the next rising edge of the default one clock, "data out" is loaded into DFF 550 to be transferred out from the output terminal of DFF 550.

Logic circuitry 560 and 570 can be tested for margin defects using a burst of two clock pulses. Logic circuitry 580 can be tested for margin defects using a burst of three clock pulses. In either case (two or three pulses) the clock pulses on a default one clock or a default zero clock can be generated by DFT 140 of FIG. 2. To generate a two clock pulse default one clock signal, the DFT 140 has to receive the burst information of two and a clock polarity control signal of logic one. To generate a three clock pulse default one clock signal, the DFT 140 has to receive the burst information of three and a clock polarity control signal of logic one.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. A Design-For-Test (DFT) circuit comprising:
   a first multiplexer coupled to receive a clock signal, an inverted version of the clock signal, and a clock polarity control signal, wherein the first multiplexer is operable to output one of the clock signal or the inverted version of the clock signal according to the clock polarity control signal;
   a burst counter coupled to the first multiplexer, wherein the burst counter is operable to output a signal at a first logic state for a predefined pulse count; and
   a second multiplexer coupled to receive the clock polarity control signal, the clock signal, and the signal output from the burst counter, wherein the second multiplexer is operable to output one of the clock polarity control signal or the clock signal according to the signal output from the burst counter.

2. The DFT circuit in claim 1, wherein an output from the second multiplexer is one of a default one clock or a default zero clock depending on whether the clock polarity control signal is at a logic one level or is at a logic zero level, respectively.

3. The DFT circuit in claim 1, wherein the second multiplexer is operable to output one of a default one clock with a number of pulses or a default zero clock with the number of pulses, wherein the number of pulses is equivalent to the predefined pulse count.

4. The DFT circuit in claim 3, wherein the predefined pulse count is equivalent to one clock cycle.

5. The DFT circuit in claim 1 further comprising:
   a third multiplexer operable to transfer information on the predefined pulse count to the burst counter from a source selected from a group consisting of: an input pin, a memory, and a programmable interconnect port.

6. The DFT circuit in claim 1, wherein the burst counter is operable to output a signal at a second logic state after the predefined pulse count.

7. An integrated circuit (IC) comprising:
   a Design-For-Test (DFT) circuit coupled to receive a clock polarity control signal and at least one clock signal, the DFT circuit is operable to generate one of a default one clock signal or a default zero clock signal based on the clock polarity control signal, wherein the default one clock signal or the default zero clock signal further comprises pulses over a predefined count period; and
   at least one Intellectual Property (IP) block coupled to receive one of the default one clock signal or the default zero clock signal from the DFT circuit, wherein the DFT circuit comprises:
      a first multiplexer coupled to receive a clock signal, an inverted version of the clock signal, and the clock polarity control signal, wherein the first multiplexer is operable to transfer one of the clock signal or the inverted clock signal according to the clock polarity control signal.

8. The IC in claim 7, wherein the DFT circuit further comprises:
   a burst counter coupled to the first multiplexer, wherein the burst counter is operable to output a burst counter output signal at a first logic state for a predefined count period; and
   a second multiplexer coupled to receive the clock polarity control signal, the clock signal, and the burst counter output signal, wherein the second multiplexer is operable to transfer one of the clock polarity control signal or the clock signal according to the burst counter output signal.

9. The IC in claim 8, wherein the DFT circuitry further comprises:
   a third multiplexer operable to transfer information of the predefined count period to the burst counter from one of a pin or a memory.

10. The IC in claim 7, wherein the at least one IP block is one of a logic array block, a digital signal processor block, a memory controller block, or a processor block.

11. The IC in claim 7, wherein the at least one IP block is coupled to receive one of the default of one clock signal or a default zero clock signal for testing.

12. The IC in claim 7, wherein the at least one IP block receives a test input, the test input propagates along the at least one IP block on edges of the pulses within one of the default one clock or the default zero clock.

13. The IC in claim 7, wherein the DFT circuit is operable to supply a default one clock to a first IP block at a first instance and a default zero clock to a second IP block at a second instance.

14. Design-for-test (DFT) circuitry comprising:
- a burst counter operable to receive a predefined pulse count and a first signal, wherein the burst counter is further operable to output a first output that is at a first logic state for the predefined pulse count, and wherein the burst counter is further operable to output a second output at a second logic state; and
- a first multiplexer coupled to a first register and an interconnect, wherein the first multiplexer is operable to provide, to the burst counter, the predefined pulse count from one of the first register or the interconnect based on an input from a second register.

15. The DFT circuitry in claim 14, wherein the burst counter is operable to receive a second signal, wherein the burst counter is operable to be activated and deactivated in response to the second signal.

16. A method to test an integrated circuit (IC) comprising:
- with a multiplexer, receiving a clock signal and static control signal;
- transferring the clock signal to a burst counter;
- sending information on a predefined count period to the burst counter;
- outputting a first signal from the burst counter for the predefined count period;
- outputting a second signal from the burst counter after the predefined count period;
- sending the clock signal to the integrated circuit for the predefined count period in response to the first signal; and
- sending the static control signal to the integrated circuit after the predefined count period in response to the second signal.

17. The method in claim 16 further comprising:
- selecting information source of the predefined count period from one of an input pin, a memory or a programmable interconnect port.

18. The method in claim 16, wherein the default clock signal is one of the default one clock signal or default zero clock signal.

* * * * *